United States Patent [19]

Kitahara et al.

[11] Patent Number: 5,130,269
[45] Date of Patent: Jul. 14, 1992

[54] HETERO-EPITAXIALLY GROWN COMPOUND SEMICONDUCTOR SUBSTRATE AND A METHOD OF GROWING THE SAME

[75] Inventors: Kuninori Kitahara, Zama; Nobuyuki Ohtsuka, Atsugi; Masashi Ozeki, Yokohama, all of Japan

[73] Assignee: Fujitsu Limited, Kanagawa, Japan

[21] Appl. No.: 342,785

[22] Filed: Apr. 25, 1989

[30] Foreign Application Priority Data

Apr. 27, 1988 [JP] Japan .................. 63-105036
Oct. 20, 1988 [JP] Japan .................. 63-264618

[51] Int. Cl.$^5$ .......................................... H01L 21/20
[52] U.S. Cl. ................................ 437/111; 437/132; 437/133; 437/976
[58] Field of Search ............... 148/DIG. 17, 56, 65, 148/72, 97, 110, 149, 169, 33, 33.1, 33.4; 156/610–614; 427/248.1, 255.1; 437/81, 84, 105, 107, 108, 110, 111, 126, 129, 132, 936, 939, 946, 945, 976

[56] References Cited

U.S. PATENT DOCUMENTS

| | | | |
|---|---|---|---|
| 4,058,430 | 11/1977 | Suntola et al. | 156/611 |
| 4,180,825 | 12/1979 | Mason | 437/126 |
| 4,588,451 | 5/1986 | Vernon | 437/126 |
| 4,767,494 | 8/1988 | Kobayashi et al. | 437/110 |
| 4,806,996 | 2/1989 | Luryi | 437/84 |
| 4,829,022 | 5/1989 | Kobayashi et al. | 437/110 |
| 4,833,103 | 5/1989 | Agostinelli et al. | 437/231 |
| 4,835,116 | 4/1989 | Lee et al. | 437/132 |
| 4,840,921 | 6/1989 | Matsumoto | 437/132 |
| 4,843,029 | 6/1989 | Joyce et al. | 437/126 |
| 4,859,627 | 8/1989 | Sunakawa | 437/126 |
| 4,933,300 | 6/1990 | Koinuma et al. | 437/110 |
| 4,963,508 | 10/1990 | Umeno et al. | 437/976 |

FOREIGN PATENT DOCUMENTS

| | | | |
|---|---|---|---|
| 0207216 | 1/1987 | European Pat. Off. | |
| 0214610 | 3/1987 | European Pat. Off. | |
| 0064118 | 4/1986 | Japan | 437/132 |
| 0001224 | 1/1987 | Japan | 437/132 |
| 0001225 | 1/1987 | Japan | 437/132 |
| 62-291909 | 12/1987 | Japan | |
| 0228714 | 9/1988 | Japan | |
| 0289812 | 11/1988 | Japan | 437/132 |

OTHER PUBLICATIONS

Applied Physics Letters; vol. 48, No. 16, 21 Apr. 1986, pp. 1083–1084, New York, USA; B. F. Levine et al.; "Long Wavelength GaSb Photoconductive Detectors Grown on Si Substrates".

Journal of Vacuum Science and Technology; vol. 5, No. 4, Jul./Aug. 1987, pp. 1184–1186, New York, USA; M. Ozeki et al.; "Kinetic Processes in Atomic-Layer Epitaxy of GaAs and AlAs Using a Pulsed Vapor-Phase Method".

Vernon et al., "Metalorganic Chemical Vapor Deposition of GaAs on Si . . . ", J. Crys. Growth, vol. 77, 1986, pp. 530–538.

Mendez et al., ". . . InAs/AlAs Strained-Layer Superlattices . . . ", Appl. Phys., A48, 1989, pp. 471–473.

Sugo et al., "Buffer Layer Effects on Residual Stress in InP on Si Substrates," Appl. Phys. Lett., 54(18), 1 May 1989, pp. 1754–1756.

Shinohara, ". . . AlAs-GaAs Superlattice Buffer Layers," Appl. Phys. Lett., 52(7), 15 Feb. 1988, pp. 543–545.

Primary Examiner—Olik Chaudhuri
Assistant Examiner—David E. Graybill
Attorney, Agent, or Firm—Armstrong & Kubovcik

[57] ABSTRACT

A method of growing a gallium arsenide single crystal layer on a silicon substrate comprises steps of growing a buffer layer of aluminum arsenide on the silicon substrate by atomic layer epitaxy, and growing the gallium arsenide single crystal layer on the buffer layer epitaxially.

4 Claims, 7 Drawing Sheets

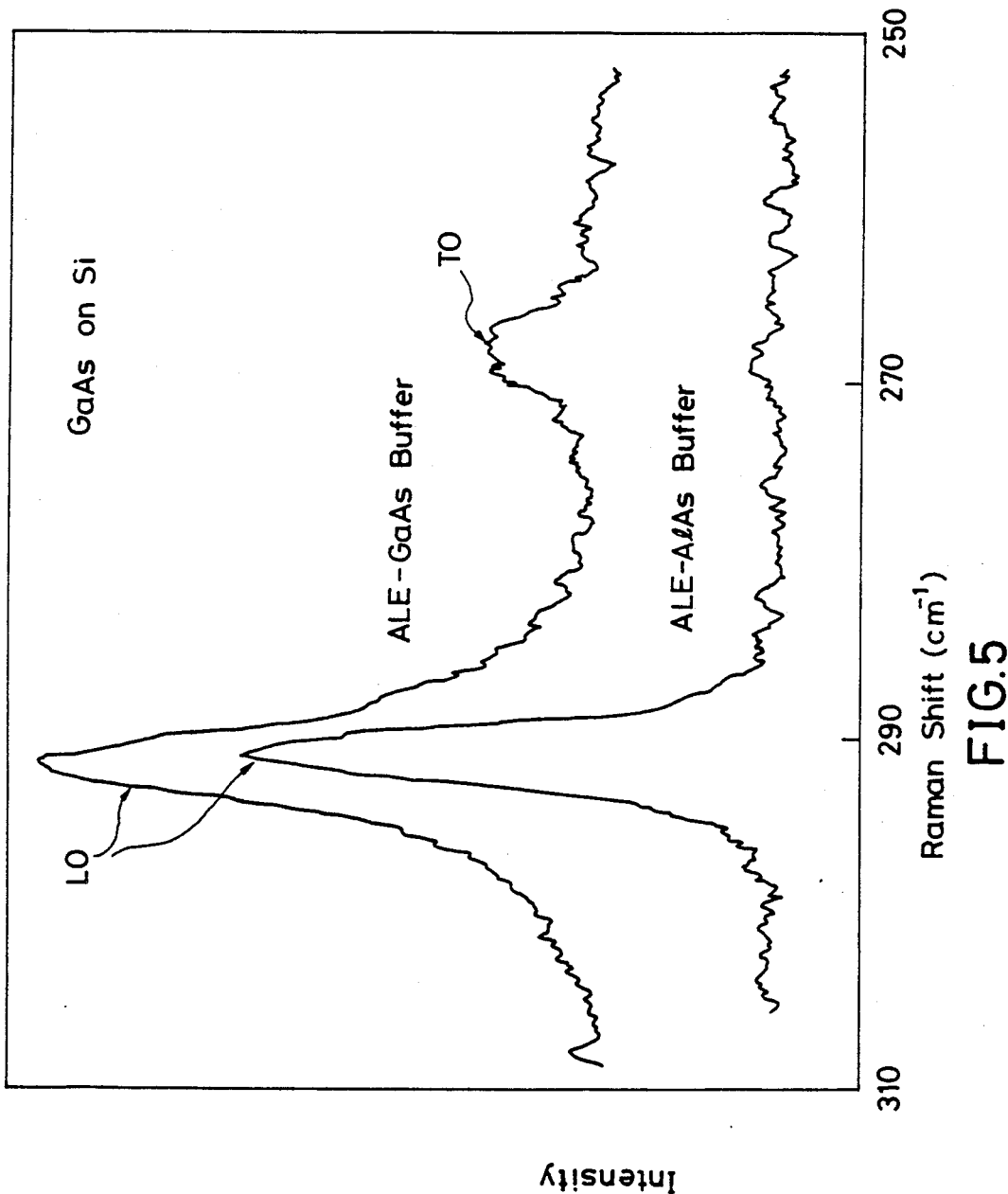

FIG.6(A) ↑ <100>
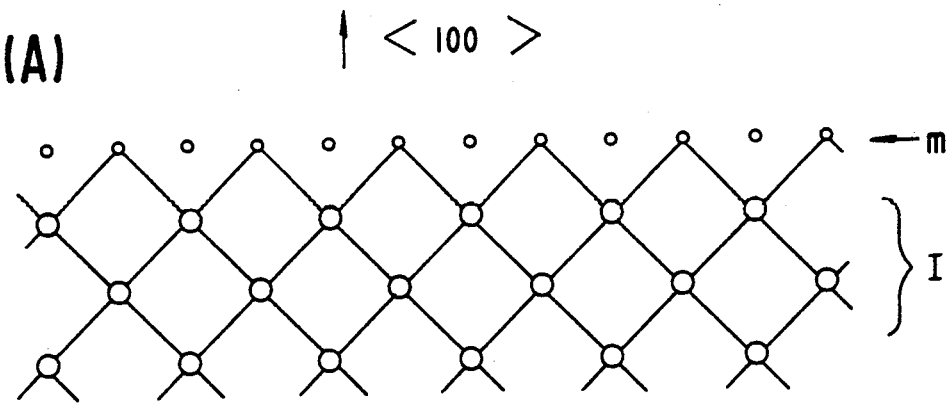
FIG.6(B) ↑ <100>
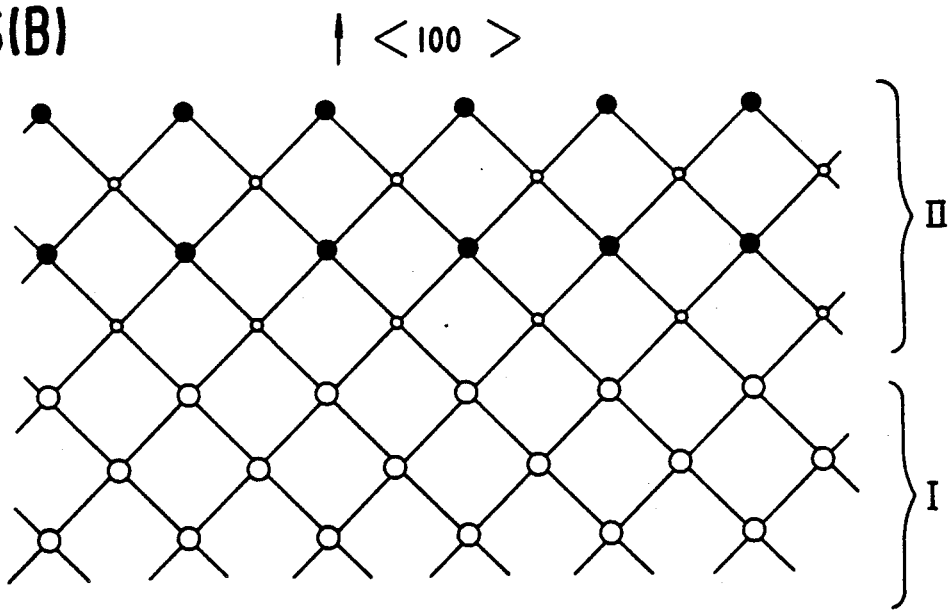
○ : Si    ○ : Al
● : As

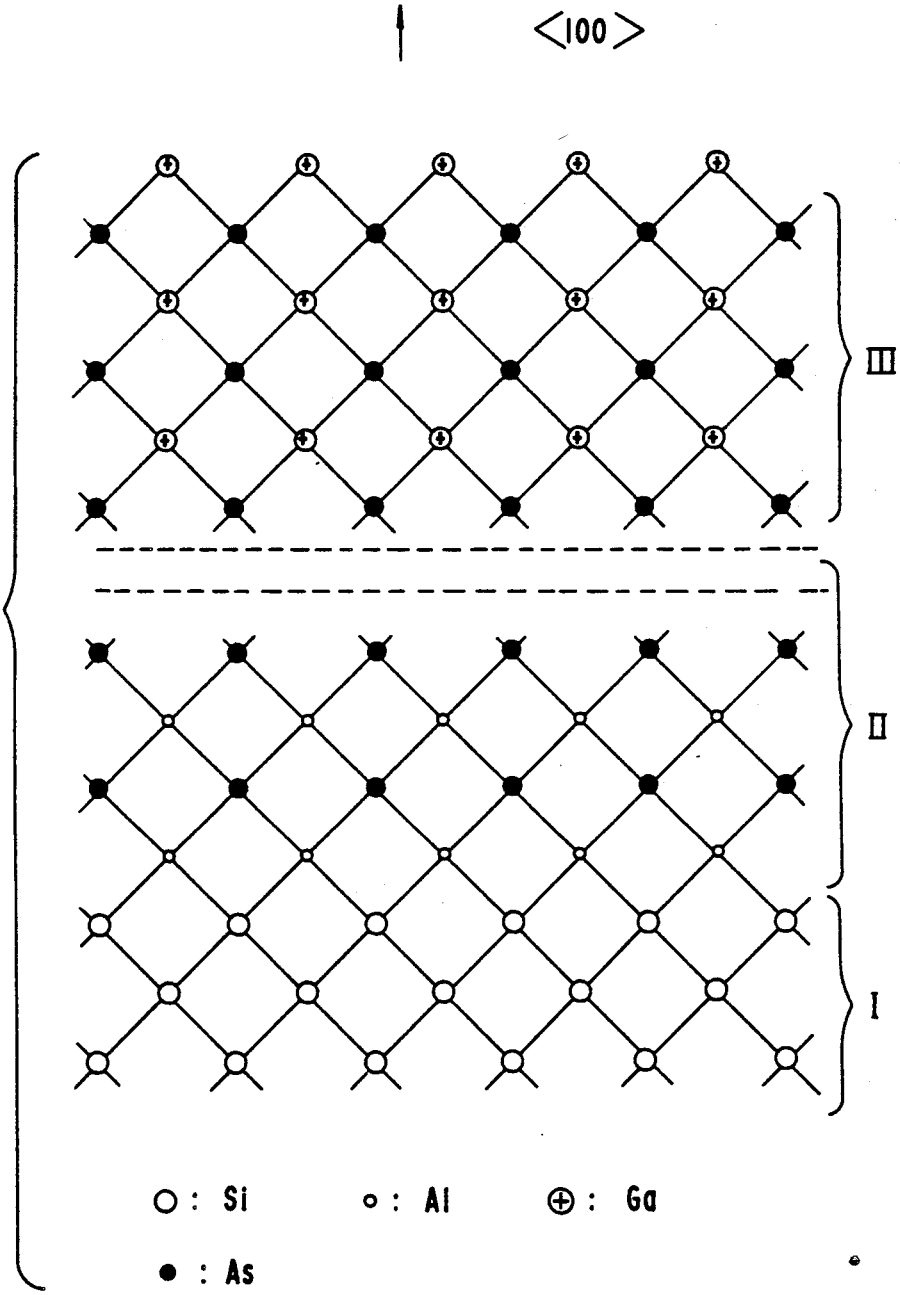

HETERO-EPITAXIALLY GROWN COMPOUND SEMICONDUCTOR SUBSTRATE AND A METHOD OF GROWING THE SAME

BACKGROUND OF THE INVENTION

The present invention generally relates to fabrication of semiconductor devices and more particularly to an epitaxial growth of a compound semiconductor layer such as gallium arsenide on a silicon wafer.

Gallium arsenide (GaAs) is a typical compound semiconductor material used for laser diodes and various fast speed semiconductor devices such as metal-semiconductor field effect transistor (MESFET), high electron mobility transistor (HEMT), heterojunction bipolar transistor (HBT) and the like because of its characteristic band structure and high electron mobility. Such a semiconductor device is constructed on a gallium arsenide wafer sliced from a gallium arsenide ingot grown as a single crystal or on a gallium arsenide substrate grown epitaxially on a surface of a silicon wafer. In the latter construction, one can avoid the difficulty of handling heavy and brittle gallium arsenide wafer during the fabrication process of the device by using a light and strong silicon wafer fabricated by a well established process for the base of the substrate. Further, one can easily obtain a large diameter wafer in such a construction. As a result, one can handle the wafer easily and reduce the manufacturing cost of the device. Further, such a wafer is suited for fabrication of a so called opto-electronic integrated circuit (OEIC) devices wherein gallium arsenide laser diode and the like are assembled together with silicon transistors on a common semiconductor chip.

When growing gallium arsenide on silicon wafer epitaxially, however, one encounters various difficulties. Such difficulties are caused mainly due to large difference in the lattice constant and thermal expansion between silicon and gallium arsenide. For example, the lattice constant of silicon is smaller than that of gallium arsenide by about 4% and the thermal expansion coefficient of silicon is smaller than that of gallium arsenide by about 230%. From simple calculation based on the difference in the lattice constant, it is predicted that the gallium arsenide substrate constructed as such contains dislocations with a density in the order of $10^{12}/cm^2$. Thus epitaxial growth of gallium arsenide layer made directly on silicon substrate is usually unsuccessful. Even if successful, such a layer involves significant defects such that they cannot be used as the substrate for a semiconductor device.

In order to eliminate these problems and obtain a gallium arsenide substrate layer having a quality satisfactory for a substrate of semiconductor device, it is proposed to interpose a buffer layer between the silicon wafer and the gallium arsenide substrate so as to absorb any stress caused as a result of mismatch in the lattice constant and thermal expansion between the wafer and the substrate. In one example, a super lattice layer is used for the buffer layer wherein a plurality of crystal layers each containing a few layers of atoms and having its own lattice constant which is different from each other are stacked on the surface of the silicon wafer before the deposition of the gallium arsenide substrate. By doing so, propagation of defects into the gallium arsenide substrate layer is prevented. Unfortunately, the formation of such a super lattice structure requires an extremely precise control of the crystal growth which is difficult to achieve with reliability in the presently available technique.

Alternatively, it is proposed to interpose a polycrystalline gallium arsenide buffer layer between the silicon substrate and the gallium arsenide layer to absorb the mismatching of the lattice constant and thermal expansion. In this approach, a thin gallium arsenide polycrystalline buffer layer having a thickness of typically 10 nm is deposited on the silicon substrate at a temperature of about 400°–450° C. prior to deposition of the single crystal gallium arsenide substrate layer. Then, the temperature is raised to about 600°–750° C. and the gallium arsenide substrate layer is deposited for a thickness of about a few microns. When the temperature is raised from the first temperature to the second temperature, the polycrystalline gallium arsenide buffer layer is re-crystalized into single crystal and the gallium arsenide substrate layer deposited thereon grows while maintaining epitaxial relation with the gallium arsenide buffer layer underneath.

In this technique, however, it is difficult to obtain a satisfactorily flat surface for the single crystal gallium arsenide layer. This is because the polycrystalline gallium arsenide buffer layer takes an island structure on the surface of the silicon wafer and the non-flat morphology of the surface of the polycrystalline gallium arsenide buffer layer is transferred to the gallium arsenide substrate layer provided thereon. In other words, the the surface of the gallium arsenide substrate layer becomes waved in correspondence to the island structure of the buffer layer. In spite of the use of reduced temperature at the time of formation of the buffer layer so as to suppress the formation of the island structure by reducing the growth rate, the island structure cannot be eliminated satisfactorily. Further, such a waved surface of the gallium arsenide substrate cannot be eliminated even if the thickness of the gallium arsenide layer is increased to a few microns or more.

Further, it is proposed to use other material such as silicon-germanium solid solution $Si_yGe_{1-y}$ for the buffer layer while changing the composition y continuously from the surface of the silicon substrate to the bottom of the gallium arsenide substrate layer as is described in the Japanese Laid-open Patent Application No. 62-87490. Alternatively, it is proposed to use a gallium arsenide based mixed crystal such as $In_xGa_{1-x}As$ or $Al_xGa_{1-x}As$ with a composition x of about $4.5 \times 10^{-3}$ for the buffer layer (Japanese Laid-open Patent Application No. 62-291909). In both of these alternatives, there is a problem in the surface morphology as already described.

On the other hand, the applicants made a discovery during a series of experiments to deposit a group III-V compound such as aluminium arsenide (AlAs) on a gallium arsenide substrate by atomic layer epitaxy (ALE) that aluminium deposited on an arsenic plane of the gallium arsenide substrate rapidly covers the surface of the substrate with a surface density corresponding to two or three molecular layers of the group III-V compound (U.S. Pat. application Ser. No. 172,671; Ozeki et al., J.Vac.Sci.Tech.B5(4), Jul/Aug. 1987 pp. 1184–1186). Further, it was found that there is a saturation or self-limiting effect in the deposition of aluminium arsenide. More specifically, there occurs substantially no additional deposition of aluminium after it is deposited on the surface of gallium arsenide for a surface density corresponding to two or three molecular layers of aluminium arsenide. In this study, however, it was not clear if such a self-limiting effect appears also when aluminium arsenide is deposited on the surface of silicon having diamond structure instead of the arsenic plane of gallium arsenide having zinc blende structure.

In the present invention, the applicants studied the hetero-epitaxial growth of group III-V compounds on silicon and discovered that epitaxial growth of a group III-V compound comprising at least one element having a strong affinity with silicon can successfully eliminate the formation of the island structure when the compound is grown on silicon in a form of alternating atomic layers of the component elements.

SUMMARY OF THE INVENTION

Accordingly, it is a general object of the present invention to provide a novel and useful method of growing a compound semiconductor layer on a wafer made of a single element and a semiconductor structure manufactured by such a method, wherein the problems aforementioned are eliminated.

Another and more specific object of the present invention is to provide a method of growing a substrate layer of a group III-V compound on a silicon wafer via a buffer layer of another group III-V compound for adjusting mismatch in the lattice between the substrate and the wafer, wherein formation of island structure in the buffer layer is effectively suppressed.

Another object of the present invention is to provide a method of growing a substrate layer of a compound semiconductor on a silicon wafer, comprising steps of depositing a buffer layer including a first element having strong affinity with silicon and a second element different from the first element such that the first element and the second element are stacked on the wafer in a form of alternating monoatomic layers, and growing the substrate layer including a component element having a less stronger affinity with silicon on the buffer layer. According to the present invention, the first element having the strong affinity with silicon covers the surface of the silicon wafer rapidly. Such a rapid coverage of the surface of the silicon wafer by the first element is particularly facilitated as a result of self-limiting effect when aluminium is chosen as the first element. As a result of the rapid coverage of the surface of the wafer, the formation of the island structure in the buffer layer is effectively suppressed and the formation of the waved surface of the substrate layer in correspondence to the island structure is effectively prevented.

Other objects and further features of the present invention will become apparent from the following detailed description when read in conjuction with attached drawings.

BRIEF DESCRIPTION OF THE DRAWINGS

FIG. 5 is a graph showing a result of Raman spectroscopy conducted for evaluating the quality of the surface of the gallium arsenide substrate layer obtained by the process of FIG. 3 in comparison with a prior art structure; and FIGS. 6(A)–(D) are drawings showing steps for growing the buffer layer and the gallium arsenide substrate layer on the silicon (100) plane by atomic layer epitaxy as shown in FIG. 3.

DETAILED DESCRIPTION

Figure 1:
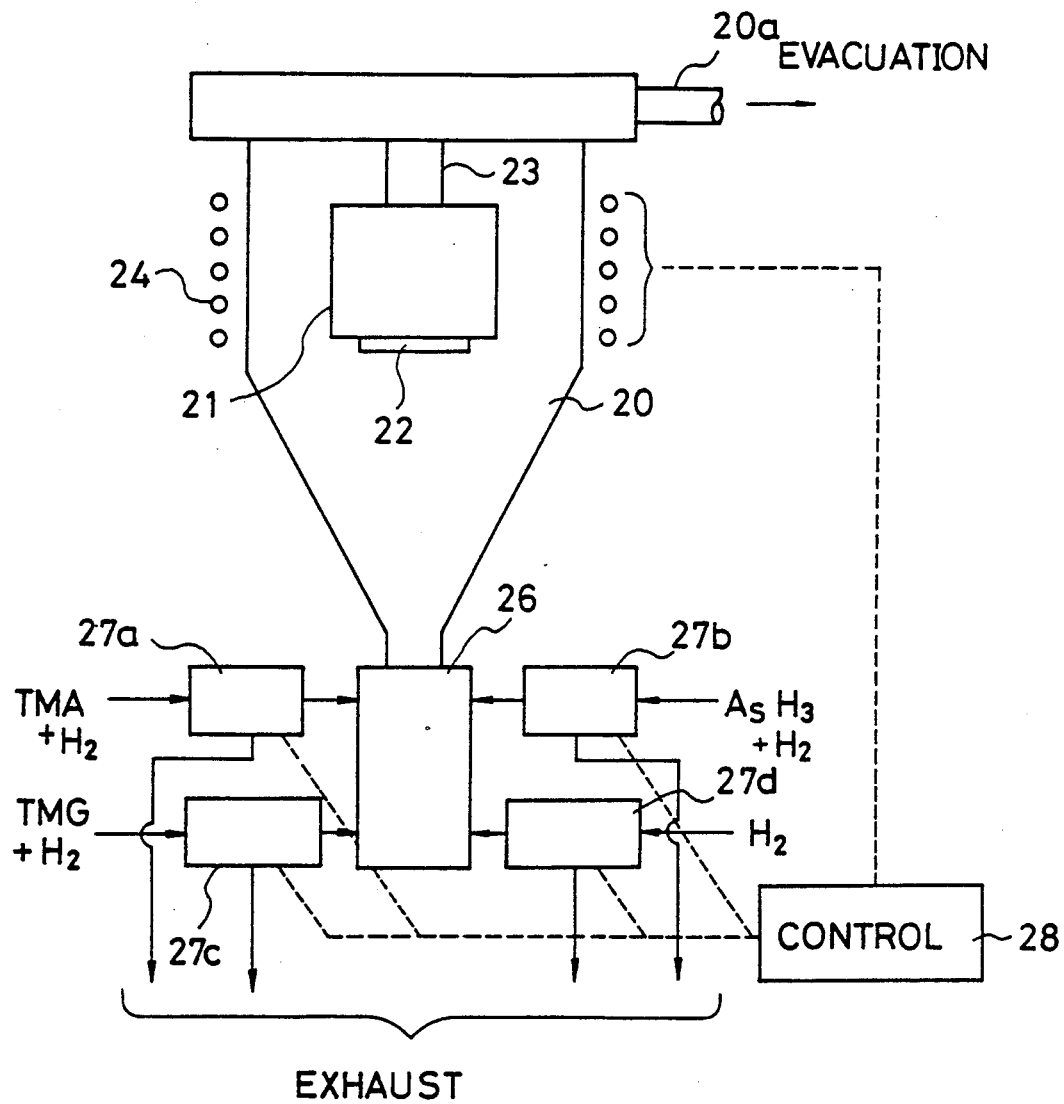
FIG. 1 is a schematical view showing an apparatus used in the present invention for growing a gallium arsenide substrate on a silicon wafer via a buffer layer.

FIG. 1 shows an apparatus used in the present invention for growing a group III-V compound substrate layer on a surface of a silicon wafer via an intervening buffer layer using ALE based on a metal-organic chemical vapor deposition (MOCVD) technique. In the embodiment described below, gallium arsenide is chosen as the group III-V compound and aluminium arsenide is used as the material for the buffer layer, as this material has a lattice constant and thermal expansion close to those of gallium arsenide to be grown thereon. Further, both of the compounds are polar compounds having ionic nature in the chemical bond. Because of these reasons, it is known that there is an excellent conformity when these two compound semiconductor materials are grown each other epitaxially.

Referring to the drawing, the apparatus has a chimney type reaction chamber 20 evacuated through a port 20a at its top, a susceptor 21 for heating a silicon wafer 22 held therein responsive to radio frequency excitation, a support pipe 23 for supporting the susceptor 21, an excitation coil 25 for generating the radio frequency excitation, a gas mixer 26 for introducing a gas or a gas mixture into the reaction chamber 20, gas supply valves 27a–27d for introducing various source and purge gases selectively into the reaction chamber 20, and a controller 28 for controlling the supply of the gases through the valves 27a–27d.

Figure 2:
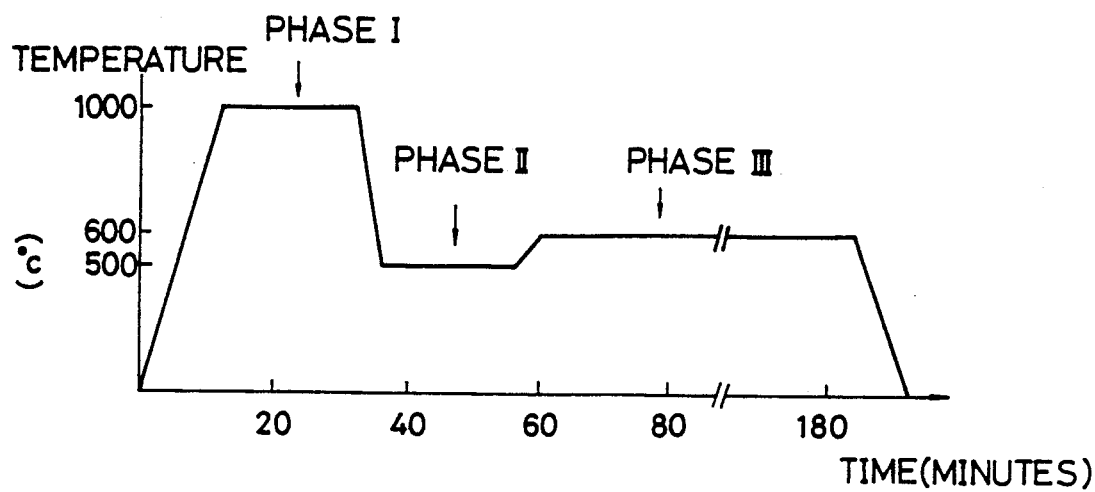
FIG. 2 is a graph showing a heat treatment employed in the present invention for growing the buffer layer and the gallium arsenide substrate layer on the silicon wafer.

At the beginning of the process, the silicon wafer 22 is baked at a temperature of about 1000° C. as illustrated in FIG. 2 by "PHASE I" under a reduced pressure so as to remove oxide film or any contamination from its surface. The pressure of the reaction chamber 20 is maintained at about 20 Torr and hydrogen in total of 2 SLM is flowed through the chamber 20 throughout the entire process. After about 20 minutes of baking, the temperature of the wafer 22 is reduced to about 500° C. in a "PHASE II" of FIG. 2 and an aluminium arsenide buffer layer is grown on the surface of the wafer 22 by ALE.

Figure 3:
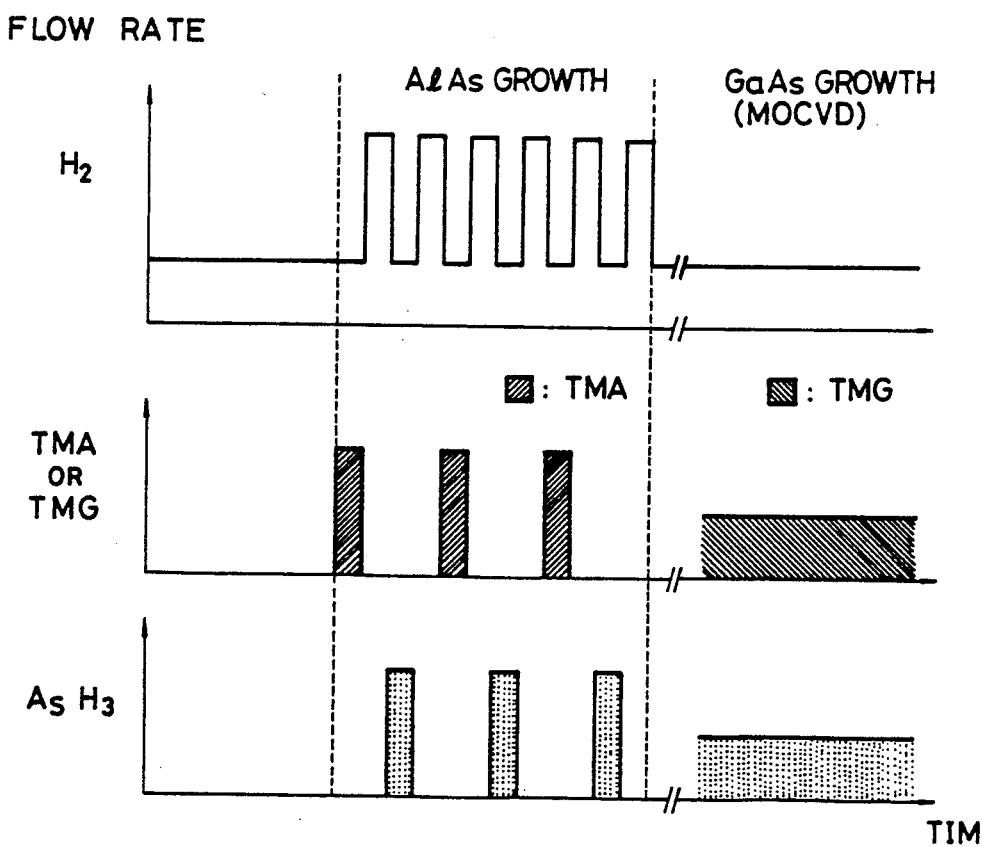
FIG. 3 is a time chart showing a gas control sequence used for growing the buffer layer and the gallium arsenide substrate layer on the silicon wafer.

FIG. 3 shows the sequence of gases introduced into the reaction chamber 20 during the PHASE II process. Referring to FIG. 3, a trimethylaluminium gas (($CH_3$)$_3$Al) referred to hereinafter as TMA is introduced first through the valve 27a with a flow rate of about 20 SCCM for 7.5 seconds using a bubbler temperature of 22° C. The TMA thus introduced is decomposed in the reaction chamber 20 and produces aluminium which covers the surface of the silicon wafer 22 as monoatomic layer as will be described later. Next, the TMA gas or any residual component species remaining after the deposition is purged from the reactor 20 by introducing hydrogen from the valve 27d for about three seconds. Next, an arsine ($AsH_3$) gas diluted by hydrogen to 10% concentration is introduced into the reaction chamber 20 from the valve 27b with a flow rate of about 480 SCCM for ten seconds. Arsine thus introduced is decomposed in the reaction chamber 20 to form arsenic to be deposited on the monoatomic aluminium layer on the surface of the silicon wafer 22. After the introduction of arsine, the arsine gas or any residual component species remaining after the deposition is purged from the reactor 20 by introducing hydrogen from the valve 27d. With this, one cycle of the gas sequence for the growth of the aluminium arsenide buffer layer is completed. It is estimated that arsenic produced as a result of decomposition of arsine is deposited on the monoatomic layer aluminium already deposited on the surface of the wafer and causes rearrangement of aluminium. Thereby, two or three molecular layers of aluminium arsenide is formed depending on the nature of the surface of the silicon wafer.

After this, the gas sequence is repeated until a desired thickness of the aluminium arsenide layer is grown on the surface of the silicon wafer 22. The thickness of the aluminium arsenide layer is chosen to be sufficient to relax the stress caused as a result of the mismatching in the lattice constant and thermal expansion between the silicon wafer and the gallium arsenide substrate. In one example, one hundred molecular layers of aluminium arsenide are grown by repeating the gas sequence. In this case, the gas sequence is repeated for fifty times.

Next, the temperature of the wafer 22 is raised to about 600° C. and a "PHASE III" of the process shown in FIG. 2 is commenced. In this phase, a gallium arsenide substrate layer is grown on the aluminium arsenide buffer layer on the silicon wafer by a suitable epitaxial growth technique such as the conventional MOCVD. In this process, it is not necessary to introduce source and purge gases selectively but the source gas for gallium and arsenic may be introduced simultaneously. In one example, a gallium arsenide layer of about 2–3μm is grown by supplying trimethylgallium ((CH$_3$)$_3$Ga) referred to hereinafter as TMG and the arsine gas with a flow rate of 2 SCCM and 40 SCCM, respectively for about 2 hours.

Figure 4:
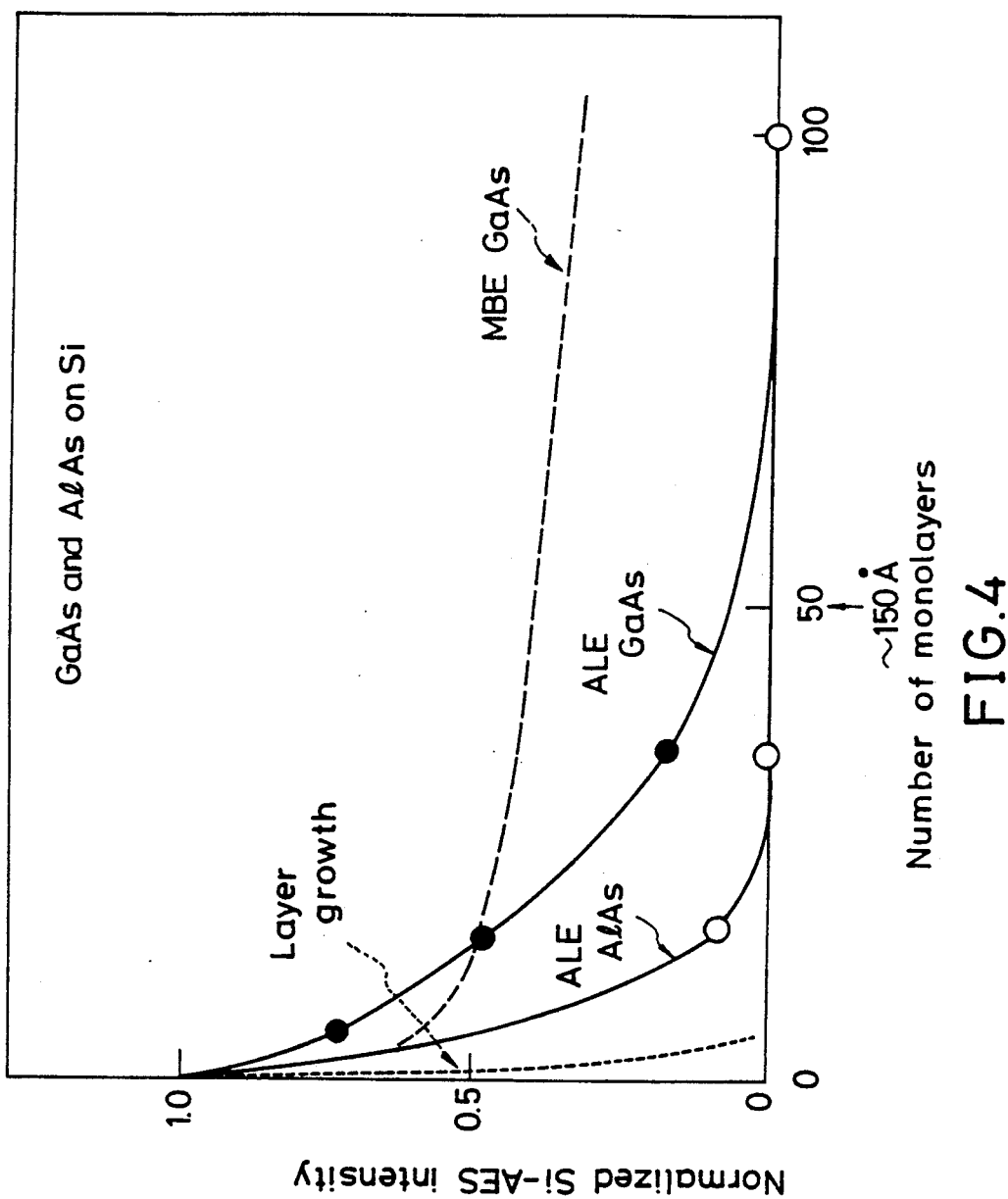
FIG. 4 is a graph showing a result of Auger electron spectroscopy conducted for evaluating the degree of coverage of surface of the silicon wafer by the buffer layer formed by the process of FIG. 3 in comparison with prior art corresponding structures.

FIG. 4 shows the result of Auger electron spectroscopy conducted on the surface of the silicon wafer 22 in the various steps for covering the surface by the aluminium arsenide buffer layer. In the drawing, the ordinate represents a relative intensity of Auger electron emitted from silicon atoms in the surface of the wafer which is covered totally or partially by the buffer layer with reference to a silicon wafer which is free from coverage by the buffer layer. In other words, the relative intensity of the Auger electron in the ordinate represents the degree of coverage of the surface of the silicon wafer by the buffer layer. When the value of the ordinate is one, it means that the surface of the silicon wafer is entirely exposed without coverage while when the value is zero, it means that the surface of the silicon wafer is completely covered by the buffer layer.

The abscissa of FIG. 4 represents the number of molecular layers of aluminium arsenide deposited on the surface of the silicon wafer 22. Thus, the continuous line designated as "ALE AlAs" in FIG. 4 shows that the surface of the silicon wafer 22 is covered almost entirely with the aluminium arsenide buffer layer after it is deposited for about 20 molecular layers. After the deposition of about 30 molecular layers of aluminium arsenide, it can be seen that the surface of the silicon wafer is totally covered by the buffer layer. This means that the surface of the silicon wafer is rapidly covered by the buffer layer without substantial formation of the island structure. The ideal coverage calculated based on perfect layer-by-layer growth of the buffer layer is represented in FIG. 4 by a dotted line designated as "LAYER GROWTH". It should be noted that the coverage of the surface represented by the line ALE AlAs is quite close to the case of the ideal coverage represented by the dotted line. In FIG. 4, the result obtained by a similar measurement for the case in which a conventional gallium arsenide buffer layer is deposited by a usual molecular beam epitaxy (MBE GaAs) is also presented by a broken line for comparison. It can be seen that, in this case, the coverage of the surface of the silicon wafer is still incomplete after the deposition of more than one hundred molecular layers. From this result, it is quite clear that there is a substantial formation of the island structure or clustering of gallium and arsenic at the surface of the wafer.

In FIG. 4, the result of the process described above is further compared with the case in which a gallium arsenide buffer layer is grown on the surface of the silicon substrate by the ALE (a continuous line designated as "ALE GaAs"). Even in comparison with this case, it is clear that the surface of the wafer is covered more rapidly when aluminium arsenide is used for the buffer layer.

FIG. 5 shows a result of evaluation of the surface of the gallium arsenide substrate grown on the aluminium arsenide buffer layer in comparison with a gallium arsenide substrate grown on a gallium arsenide buffer layer which in turn is grown on the surface of the silicon wafer by ALE. The evaluation is made by irradiating an argon-ion laser beam on the surface of the gallium arsenide substrate layer and observing a Raman scattering. In FIG. 5, the strong peak designated by "LO" corresponds to the Raman scattering attributed to the (100) plane of gallium arsenide while the more diffused peak indicated as "TO" corresponds to the presence of other planes of gallium arsenide and/or defects. It can be seen that only the (100) plane is observed in the case of the gallium arsenide substrate grown on the aluminium arsenide buffer layer indicating that the crystalline quality of the gallium arsenide substrate is sufficient, while distortion of crystal plane is observed when the gallium substrate is grown on the gallium arsenide buffer layer grown on the silicon substrate.

Next, the growth of the buffer layer and the substrate layer on the silicon wafer will be described with reference to schematical crystal structure diagrams of FIGS. 6(A)–(D).

Referring to FIG. 6(A), aluminium atoms formed as a result of pyrolysis of TMA in the phase II of FIG. 2 settle on the (100) plane of a silicon wafer I in a form of a monoatomic layer m as a result of its strong affinity to silicon. In the following description, the term affinity is used as a qualitative measure representing the degree of chemical bond or magnitude of heat of formation of a compound formed when two different elements are combined each other. Although the sites occupied by the aluminium atoms is still hypothetical, aluminium atoms are deposited with a surface density corresponding to two molecular layers of aluminium arsenide uniformly over the entire surface of the wafer I without causing clustering. Qualitatively speaking, this phenomenon means that aluminium is more stable when it is combined with silicon than it is clustered on the surface of the silicon wafer because of its strong affinity to silicon. Further, it was observed that there appears a self-limiting effect similarly to the case of deposition of aluminium on gallium arsenide as is reported previously by the applicants (U.S. Pat. application Ser. No. 172,671 by the present applicants), when aluminium is supplied beyond the surface density corresponding to the two molecular layers of aluminium arsenide, although such a self-limiting effect of aluminium on silicon having diamond structure is first discovered in the study which forms the basis of the present invention. Further, it was found that the density of aluminium is saturated at a value corresponding to three layers of aluminium arsenide molecules when it is deposited on the (110) plane of silicon similarly to the case of the ALE on the gallium arsenide (110) plane.

Figure 6D:
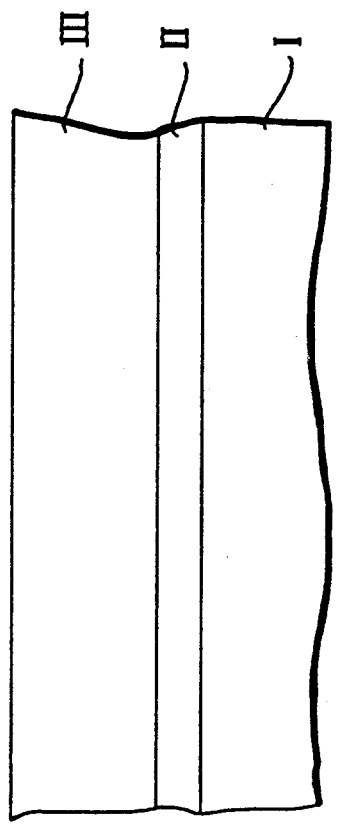

Next, arsenic atoms formed as a result of the pyrolysis of arsine is deposited on the aluminium monoatomic layer m. When the arsenic atoms reach the aluminium monoatomic layer m, the aluminium atoms are rearranged and there is formed the two molecular layers of aluminium arsenide as shown in FIG. 6(B) by a layer II. As the initial distribution of aluminium is uniform throughout the entire surface of the wafer I, there is no formation of the island structure in the layer II even if arsenic is deposited thereon. By repeating the supply of TMA and arsine with intervening purging by hydrogen as already described, the layer II is grown to a desired thickness and forms the buffer layer. In this layer II, the aluminium atom and the arsenic atoms are stacked alternately. After the formation of the buffer layer II, a gallium arsenide layer III is formed by an ordinary MOCVD as already described or by molecular beam epitaxy (MBE) as shown in FIG. 6(C). As the gallium arsenide has a lattice constant and thermal expansion which are almost identical to those of aluminium arsenide, there is no difficulty in the deposition of gallium arsenide on aluminium arsenide thus covering the surface of the silicon wafer. The overall structure of the gallium arsenide substrate thus obtained comprises the silicon wafer I, the aluminium arsenide buffer layer II and the gallium arsenide substrate layer III as shown in FIG. 6(D). As already described, the buffer layer II absorbs the stress caused as a result of mismatching in the lattice constant and thermal expansion between the wafer I and the substrate layer III. As the aluminium arsenide has a similar lattice constant and thermal expansion to those of the gallium arsenide, the gallium arsenide substrate layer III thus grown is almost free from defects and can be used for a substrate of the compound semiconductor device without problem.

Further, it was found that the growth of the buffer layer II may be made by depositing arsenic first on the silicon wafer and then depositing aluminium. In this case, the sequence of TMA and arsine is simply reversed from those of FIG. 3 without changing the duration or other conditions for the ALE. In this case, too, the formation of the island structure in the buffer layer is effectively suppressed and the obtained gallium arsenide substrate shows a flat surface. Although the mechanism of suppressing of the island structure in this case is not certain, one may suppose that arsenic in the first monoatomic layer on the silicon wafer distributes uniformly over the silicon wafer, and then aluminium is distributed uniformly over the arsenic monoatomic layer.

Further, the group V elements to be deposited on silicon as the component element of the buffer layer II is not limited to arsenic but nitrogen (N) and phosphorus (P) both having stronger affinity to silicon than gallium or arsenic constituting the substrate layer may be used as well. When such a group V elements are deposited, they are distributed uniformly over the surface of the silicon wafer by rapidly combining with silicon and the island growth of the buffer layer is suppressed. It should be noted that the order of deposition of aluminium and such group V elements in the buffer layer V during the ALE may be reversed similarly to the case of the ALE growth of the aluminium arsenide buffer layer. When using nitrogen or phosphorus as the group V element, ammonia ($NH_3$) or phosphine ($PH_3$) may be used as the source gas for these elements.

When the compound substrate layer to be grown on the silicon wafer is indium phosphide (InP) instead of gallium arsenide, it was found that compounds comprising elements such as aluminium, gallium and nitrogen having stronger affinity to silicon than indium or phosphorus constituting the substrate layer is suitable for the buffer layer II.

Further, the ALE of the buffer layer is not limited to those described which are based on MOCVD but molecular beam epitaxy may be used as long as the supply of the element can be made alternately. Furthermore, the growth of the substrate layer is not limited to MOCVD but conventional molecular beam epitaxy may be used as well.

Further, the present invention is not limited to these embodiments but various variations and modifications may be made without departing from the scope of the invention.

What is claimed is:

1. A method of growing a gallium arsenide single crystal layer on a silicon substrate, comprising the steps of:
   growing a buffer layer of aluminum arsenide on the silicon substrate epitaxially; and
   growing the gallium arsenide single crystal layer on the buffer layer epitaxially,
   said growth of the buffer layer being made by an atomic layer epitaxy process.

2. A method as claimed in claim 1 in which said step of growing the buffer layer comprises alternated deposition of aluminum and arsenic wherein aluminum is first deposited on the silicon substrate.

3. A method as claimed in claim 1 in which said step of growing the buffer layer comprises alternated deposition of aluminum and arsenic wherein arsenic is first deposited on the silicon substrate.

4. A method of growing a layer of a compound semiconductor material on a single component substrate of a first element, said method comprising the steps of:
   growing a buffer layer of another compound semiconductor material consisting essentially of second and third elements that are different from said first element, each of said second and third elements forming a compound having a first heat of formation when reacted with said first element, on a surface of said semiconductor substrate epitaxially such that the second and third elements are stacked in a form of alternating monoatomic layers, said growth of the buffer layer being made by an atomic layer epitaxy process; and
   growing the layer of the first mentioned compound semiconductor material epitaxially on said buffer layer, said first mentioned compound semiconductor material comprising fourth and fifth elements each of which forms another compound having a second heat of formation which is substantially smaller than the first heat of formation when reacted with said first element.

* * * * *